United States Patent
Kato

(10) Patent No.: US 9,126,407 B1
(45) Date of Patent: Sep. 8, 2015

(54) LIQUID DISCHARGE APPARATUS AND PIEZOELECTRIC ACTUATOR

(71) Applicant: Brother Kogyo Kabushiki Kaisha, Nagoya-shi, Aichi-ken (JP)

(72) Inventor: Yasuo Kato, Aichi-ken (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 14/623,828

(22) Filed: Feb. 17, 2015

(30) Foreign Application Priority Data

Feb. 24, 2014 (JP) ................. 2014-032547

(51) Int. Cl.
*B41J 2/045* (2006.01)
*B41J 2/14* (2006.01)
*H01L 41/047* (2006.01)

(52) U.S. Cl.
CPC .......... *B41J 2/14201* (2013.01); *B41J 2/14233* (2013.01); *H01L 41/0477* (2013.01)

(58) Field of Classification Search
CPC ................. B41J 2/14233; B41J 2002/14217; B41J 2/04581; B41J 2002/14258; B41J 2002/14491; B41J 2/161; B41J 2002/14241; B41J 2002/14266; H01L 41/0805; H01L 41/18; H01L 41/04; H01L 41/0477
USPC .......................... 347/68, 70–72; 310/311, 312
See application file for complete search history.

(56) References Cited

U.S. PATENT DOCUMENTS

| | | | |
|---|---|---|---|
| 6,758,554 B2 * | 7/2004 | Kamei et al. | 347/70 |
| 7,922,300 B2 * | 4/2011 | Sugahara | 347/68 |
| 7,976,133 B2 * | 7/2011 | Sugahara | 347/68 |

FOREIGN PATENT DOCUMENTS

JP 2012-206442 10/2012

* cited by examiner

*Primary Examiner* — An Do
(74) *Attorney, Agent, or Firm* — Frommer Lawrence & Haug LLP

(57) ABSTRACT

A liquid discharge apparatus includes: a flow passage structure; and a piezoelectric actuator which is joined to the flow passage structure, the piezoelectric actuator including: a first piezoelectric layer; a second piezoelectric layer; a plurality of first electrodes which are arranged on an upper surface of the first piezoelectric layer; a second electrode which is arranged between the first piezoelectric layer and the second piezoelectric layer; a first conductive pattern which is arranged in an area disposed on an outer side of the plurality of first electrodes on the upper surface of the first piezoelectric layer; a conducting portion which is arranged in a through-hole penetrating through the first piezoelectric layer, the through-hole being formed in the first conductive pattern; and a second conductive pattern which is arranged between the through-hole and the plurality of first electrodes on the upper surface of the first piezoelectric layer.

17 Claims, 10 Drawing Sheets

LIQUID DISCHARGE APPARATUS AND PIEZOELECTRIC ACTUATOR

CROSS REFERENCE TO RELATED APPLICATION

The present application claims priority from Japanese Patent Application No. 2014-032547, filed on Feb. 24, 2014, the disclosure of which is incorporated herein by reference in its entirety.

BACKGROUND OF THE INVENTION

1. Field of the Invention

The present invention relates to a liquid discharge apparatus and a piezoelectric actuator.

2. Description of the Related Art

Japanese Patent Application Laid-open No. 2012-206442 discloses a piezoelectric actuator for an ink jet head for discharging an ink from nozzles. The piezoelectric actuator is joined to a flow passage unit of the ink jet head to apply the discharge energy to the ink contained in the plurality of nozzles of the flow passage unit respectively. The piezoelectric actuator has two stacked piezoelectric layers. In the following description, the piezoelectric layer, which is included in the two stacked piezoelectric layers and which is disposed on the side of the flow passage unit, is referred to as "lower piezoelectric layer", and the other piezoelectric layer is referred to as "upper piezoelectric layer" (in Japanese Patent Application Laid-open No. 2012-206442, the lower piezoelectric layer is mentioned as "vibration plate" and the upper piezoelectric layer is mentioned as "piezoelectric layer" respectively). The piezoelectric actuator of Japanese Patent Application Laid-open No. 2012-206442 further includes a plurality of individual electrodes which are provided on the upper surface of the upper piezoelectric layer corresponding to the plurality of nozzles of the flow passage unit, and a common electrode which is provided between the two piezoelectric layers.

Furthermore, a plurality of surface electrodes are provided on the upper surface of the upper piezoelectric layer. Each of the surface electrodes is connected to the common electrode by a conductive material charged into a through-hole penetrating through the upper piezoelectric layer. Moreover, the plurality of individual electrodes and the plurality of surface electrodes, which are arranged on the upper surface of the upper piezoelectric layer, are connected a wiring member respectively. The ground electric potential and the driving electric potential are selectively applied to the individual electrode by the wiring member. On the other hand, the common electrode is connected to the wiring member, and thus the common electrode is always retained at the ground electric potential.

The piezoelectric layer, which constructs the piezoelectric actuator described above, is formed of a piezoelectric ceramics as a brittle material. Therefore, any crack is formed in some cases, for example, during the calcination (sintering) and the handling in the post-process after the calcination. In particular, the following fact has been revealed. That is, when the through-hole is formed through the upper piezoelectric layer, the crack appears with ease at the portion of the lower piezoelectric layer overlapped with the through-hole as compared with other portions, for example, because the thickness is locally thin and the strength is weak or the stress concentration is caused with ease.

If the piezoelectric actuator is joined to the flow passage unit by using an adhesive in a state in which the crack appears at the portion of the lower piezoelectric layer overlapped with the through-hole, it is feared that a part of the excessive adhesive may permeate into the crack, the adhesive may overflow to the outside from the through-hole, and the adhesive may flow out to the upper surface of the upper piezoelectric layer. If the adhesive is spread to the individual electrode formed on the upper piezoelectric layer, the conduction failure is caused with respect to the wiring member. Furthermore, it is also feared that the deformation of the piezoelectric actuator may be inhibited.

SUMMARY OF THE INVENTION

An object of the present teaching is to avoid such a situation that an adhesive, which overflows from a crack to the outside of a through-hole, is spread to an electrode formed on one piezoelectric layer, if the crack is formed at a portion of the one piezoelectric layer overlapped with the through-hole of the other piezoelectric layer in a piezoelectric actuator constructed by stacking the two piezoelectric layers.

According to a first aspect of the present teaching, there is provided a liquid discharge apparatus including:

a flow passage structure which is formed with liquid flow passages including a plurality of nozzles and a plurality of pressure chambers communicated with the plurality of nozzles respectively; and a piezoelectric actuator which is joined to the flow passage structure, the piezoelectric actuator including:

a first piezoelectric layer which covers the plurality of pressure chambers;

a second piezoelectric layer which covers the plurality of pressure chambers and which is arranged to be overlapped on a flow passage structure side of the first piezoelectric layer;

a plurality of first electrodes which are arranged on a surface of the first piezoelectric layer on a side opposite to the second piezoelectric layer and which are opposed to the plurality of pressure chambers respectively;

a second electrode which is arranged between the first piezoelectric layer and the second piezoelectric layer;

a first conductive pattern which is arranged in an area disposed on an outer side of the plurality of first electrodes on the surface of the first piezoelectric layer on the side opposite to the second piezoelectric layer;

a conducting portion which is arranged in a through-hole penetrating through the first piezoelectric layer and which allows the second electrode and the first conductive pattern to be in conduction, the through-hole being formed in the first conductive pattern; and a second conductive pattern which is arranged between the through-hole and the plurality of first electrodes on the surface of the first piezoelectric layer on the side opposite to the second piezoelectric layer.

According to a second aspect of the present teaching, there is provided a piezoelectric actuator including:

a first piezoelectric layer;

a second piezoelectric layer which is overlapped with the first piezoelectric layer;

a plurality of first electrodes which are arranged on a surface of the first piezoelectric layer on a side opposite to the second piezoelectric layer;

a second electrode which is arranged between the first piezoelectric layer and the second piezoelectric layer;

a first conductive pattern which is arranged in an area disposed on an outer side of the plurality of first electrodes on the surface of the first piezoelectric layer on the side opposite to the second piezoelectric layer;

a conducting portion which is arranged in a through-hole penetrating through the first piezoelectric layer and which allows the second electrode and the first conductive pattern to be in conduction, the through-hole being formed in the first conductive pattern; and a second conductive pattern which is arranged between the through-hole and the plurality of first electrodes on the surface of the first piezoelectric layer on the side opposite to the second piezoelectric layer.

DESCRIPTION OF THE PREFERRED EMBODIMENTS

Next, an explanation will be made about an embodiment of the present teaching. At first, an explanation will be made about a schematic arrangement of an ink jet printer 1 with reference to FIG. 1. In the following description, the front side of the paper surface of FIG. 1 is defined as "upward", the back side of the paper surface is defined as "downward", and the words to indicate the directions of "upper" and "lower" are appropriately used to make the explanation.

[Schematic Arrangement of Printer]

Figure 1:
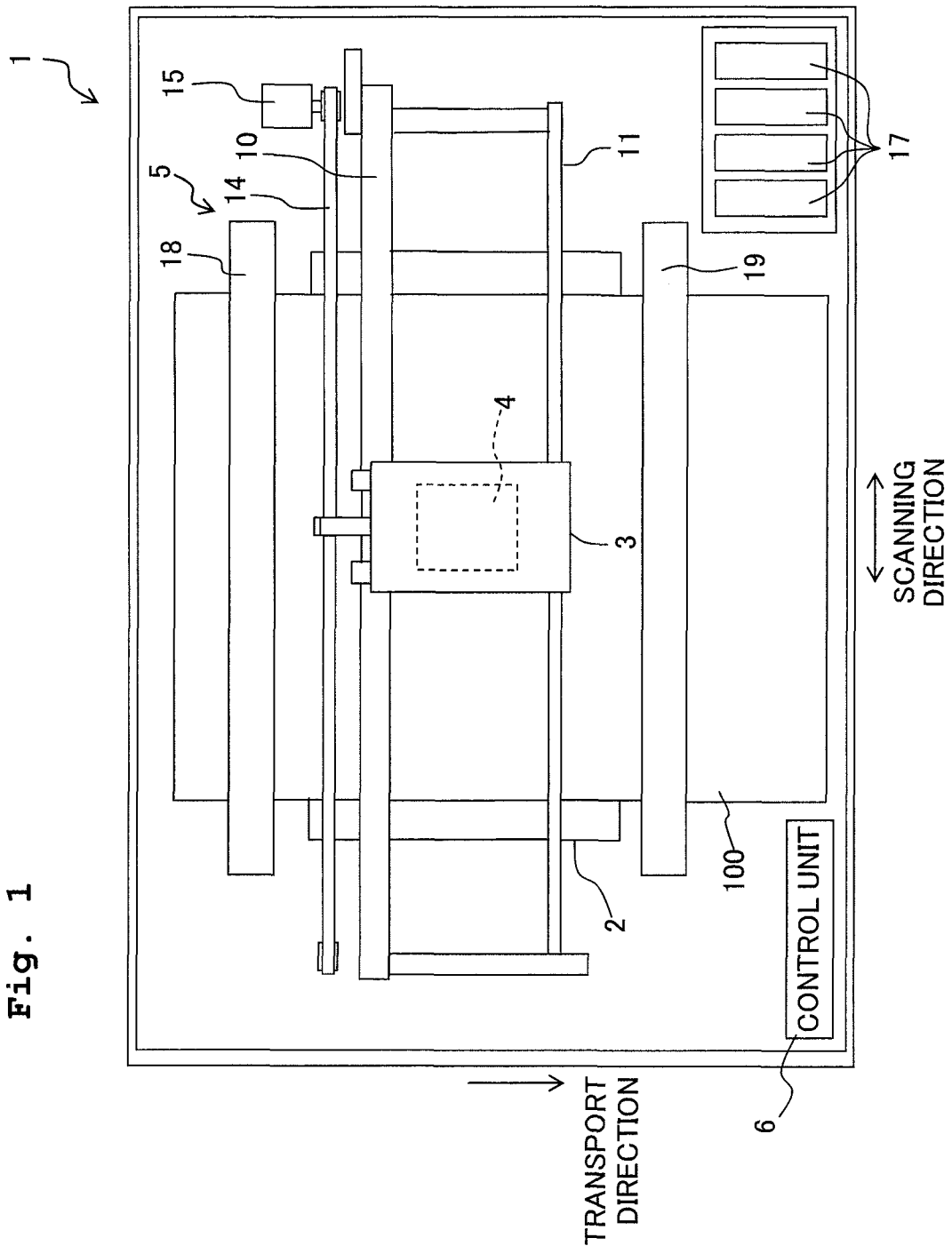
FIG. 1 shows a schematic plan view illustrating a printer according to an embodiment of the present teaching.

As shown in FIG. 1, the ink jet printer 1 includes, for example, a platen 2, a carriage 3, an ink jet head 4, a transport mechanism 5, and a control unit 6.

The recording paper 100, which is a recording medium, is placed on the upper surface of the platen 2. The carriage 3 is constructed reciprocatively movably in the scanning direction along two guide rails 10, 11 in an area opposed to the platen 2. An endless belt 14 is connected to the carriage 3. The endless belt 14 is driven by a carriage driving motor 15, and thus the carriage 3 is moved in the scanning direction.

The ink-jet head 4 is attached to the carriage 3, and the ink jet head 4 is movable in the scanning direction together with the carriage 3. The ink jet head 4 is connected by unillustrated tubes to ink cartridges 17 of four colors (for example, black, yellow, cyan, and magenta) installed to the printer 1. Furthermore, a plurality of nozzles 25 (see FIGS. 2 to 5) are formed on the lower surface (surface disposed on the back side of the paper surface of FIG. 1) of the ink-jet head 4. The four color inks, which are supplied from the ink cartridges 17, are discharged by the ink jet head 4 from the plurality of nozzles 25 onto the recording paper 100 placed on the platen 2.

The transport mechanism 5 has two transport rollers 18, 19 which are arranged to interpose the platen 2 in the transport direction. The transport mechanism 5 transports the recording paper 100 placed on the platen 2 in the transport direction by means of the two transport rollers 18, 19.

The control unit 6 includes, for example, ROM (Read Only Memory), RAM (Random Access Memory), and ASIC (Application Specific Integrated Circuit) including various control circuits. The control unit 6 executes various processes such as the printing and the like to the recording paper 100 by ASIC in accordance with programs stored in ROM. For example, in the printing process, the control unit 6 controls, for example, the ink-jet head 4 and the carriage driving motor 15 on the basis of the printing instruction inputted from an external apparatus such as PC or the like to print, for example, an image on the recording paper 100. Specifically, the control unit 6 alternately allows the execution of the ink discharge operation in which the inks are discharged while moving the ink-jet head 4 in the scanning direction together with the carriage 3 and the execution of the transport operation in which the recording paper 100 is transported in the transport direction by a predetermined amount by the transport rollers 18, 19.

[Ink-Jet Head]

Figure 2:
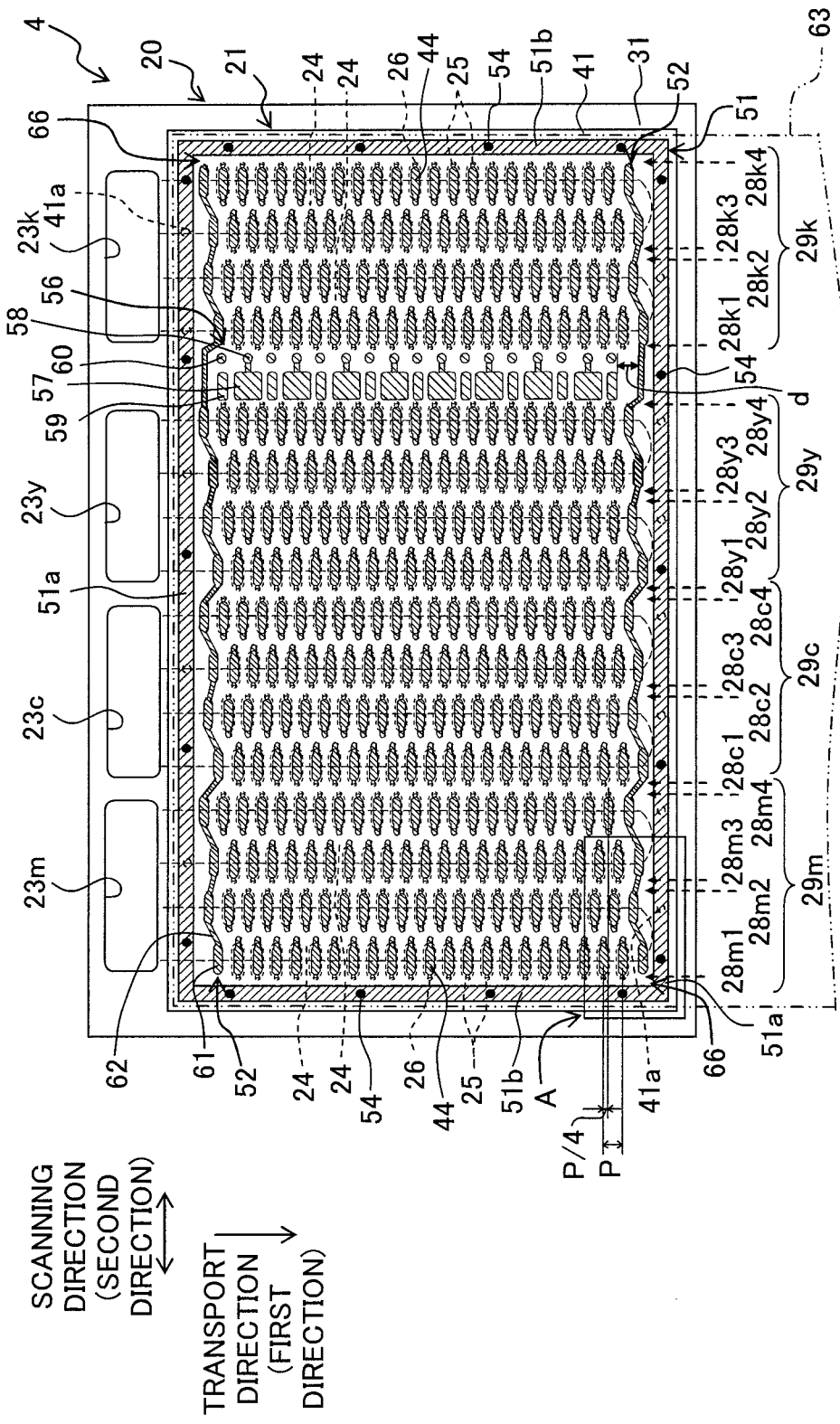
FIG. 2 shows a plan view illustrating an ink jet head.
Figure 3:
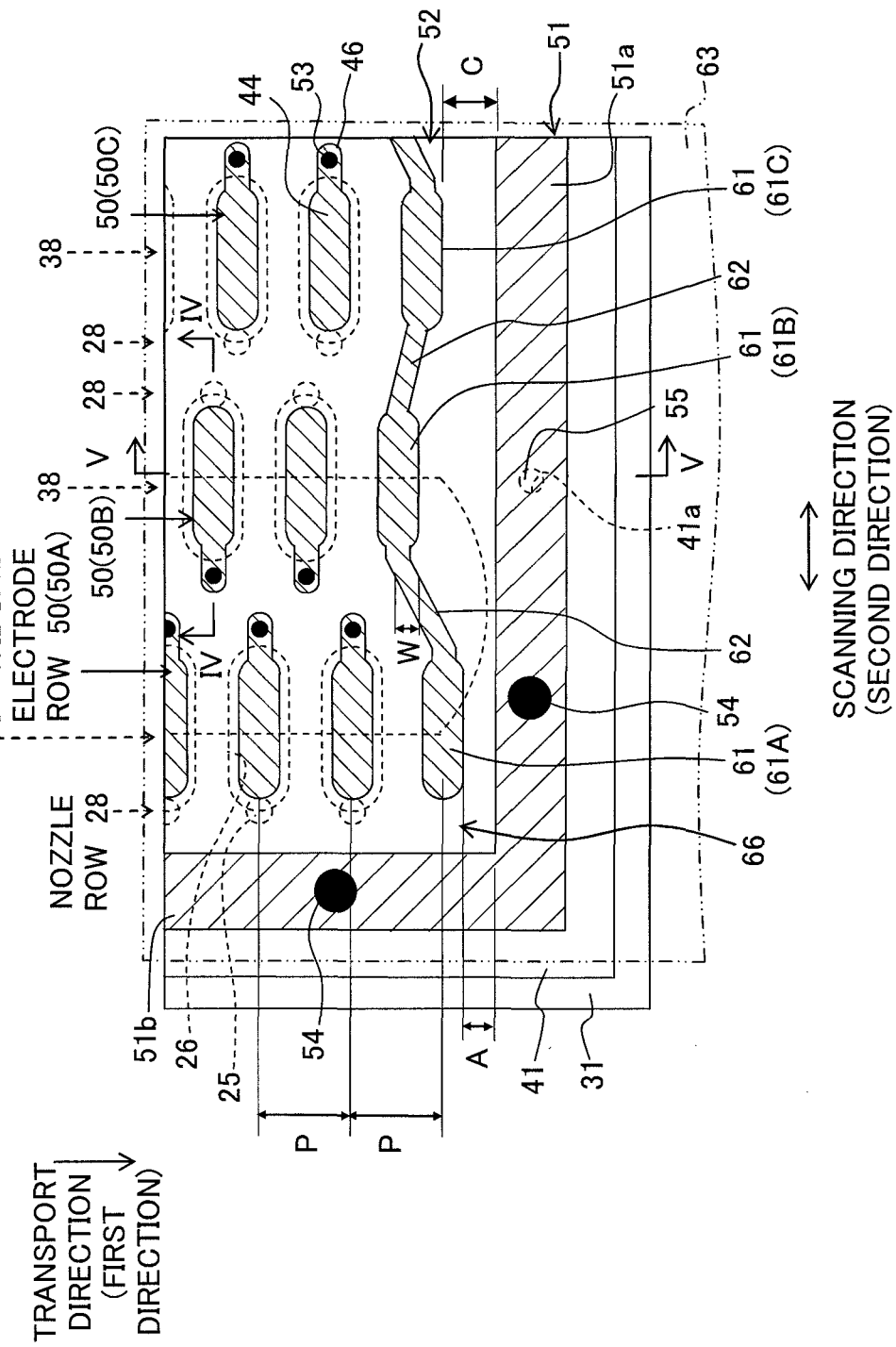
FIG. 3 shows an enlarged view of Part A shown in FIG. 2.
Figure 4:
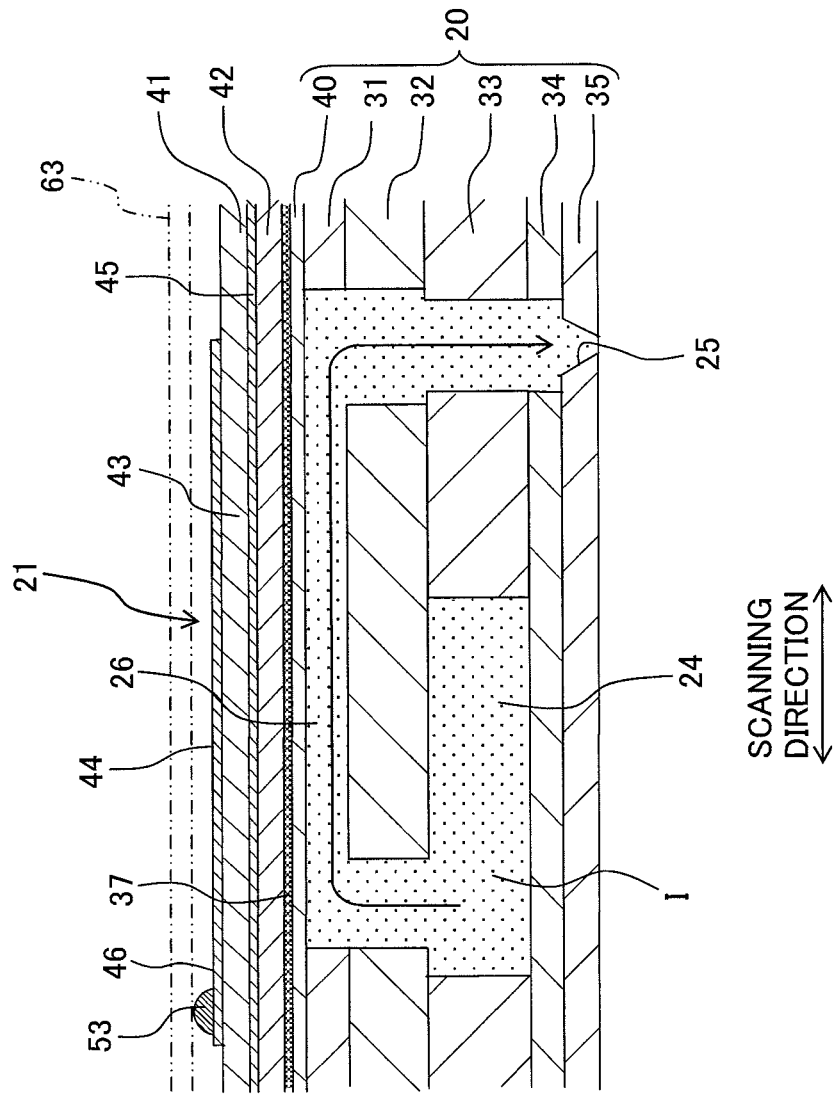
FIG. 4 shows a sectional view taken along a line IV-IV shown in FIG. 3.
Figure 5:
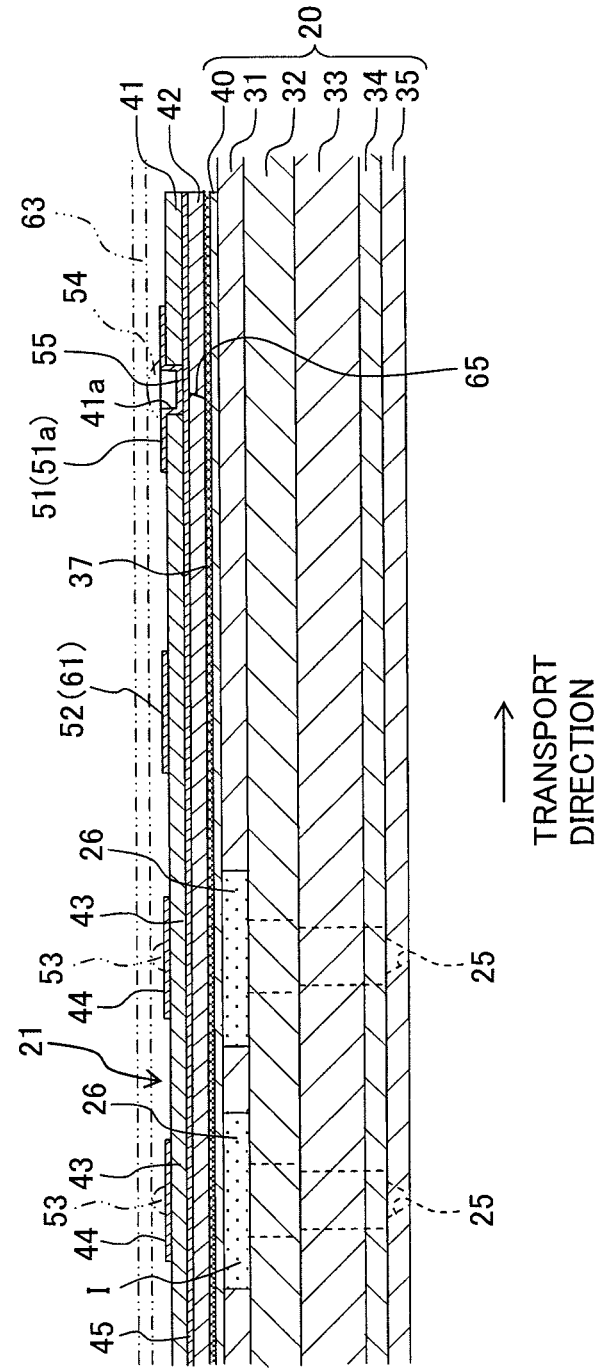
FIG. 5 shows a sectional view taken along a line V-V shown in FIG. 3.

Next, the ink-jet head 4 will be explained with reference to FIGS. 2 to 5. In FIGS. 2, 4, and 5, COF (Chip on Film) 63, which is connected to a piezoelectric actuator 21 of the ink-jet head 4, is schematically depicted by alternate long and two short dashes lines. In FIGS. 2 and 3, the front side of the paper surface is designated as the upward (top), and the back side of the paper surface is designated as the downward (bottom) in the same manner as in FIG. 1. As shown in FIGS. 2 to 5, the ink-jet head 4 is provided with a flow passage unit 20 and the piezoelectric actuator 21.

[Arrangement of Flow Passage Unit]

As shown in FIGS. 4 and 5, the flow passage unit 20 has five plates 31 to 35 for which flow passage holes are formed respectively, and an ink sealing film 40 which is joined to the upper surface of the plate 31. The materials of the five plates 31 to 35 and the ink sealing film 40 are not specifically limited. However, for example, those formed of a metal material having high corrosion resistance such as stainless steel or the like can be preferably used for the four plates 31 to 34 disposed on the upper side. The plate 35, which is positioned on the lowermost side, is the nozzle plate for which the plurality of nozzles 25 are formed. Those formed of a resin such as polyimide or the like can be preferably used for the nozzle plate 35. Those formed of a material having low ink permeability, for example, those formed of a metal material such as stainless steel or the like can be preferably used for the ink sealing film 40. Ink flow passages as described later on are formed for the flow passage unit 20 by allowing the respective flow passage holes to be in communication when the five plates 31 to 35 are stacked.

As shown in FIG. 2, four ink supply holes 23, which are connected to the four ink cartridges 17 (see FIG. 1), are formed in the area of the upper surface of the plate 31 of the flow passage unit 20 disposed on the upstream side in the transport direction to which the ink sealing film 40 is not joined. In the following description, as for the constitutive components corresponding to the inks of black (K), yellow (Y), cyan (C), and magenta (M) respectively, any symbol or sign of "k" to indicate black, "y" to indicate yellow, "c" to indicate cyan, or "m" to indicate magenta will be appropriately affixed to the reference numeral to indicate the concerning constitutive component so that the correspondence to any ink is clarified. For example, the ink supply hole 23$k$ is the ink supply hole 23 which is connected to the ink cartridge 17 for the black ink, and the black ink is supplied thereto.

Furthermore, eight manifolds 24, which are connected to the four ink supply holes 23 respectively, are formed in the flow passage unit 20. The two manifolds 24 are connected to one ink supply hole 23. The ink, which is stored in the ink cartridge 17 (see FIG. 1), is supplied to each of the manifolds 24 via the ink supply hole 23. Furthermore, the eight manifolds 24 extend in the transport direction respectively.

Moreover, the flow passage unit 20 has the plurality of nozzles 25 which are formed for the plate 35 disposed on the lowermost side of the five plates 31 to 35, and a plurality of pressure chambers 26 which are formed for the plate 31 disposed on the uppermost side (see FIG. 4).

As shown in FIG. 2, the plurality of nozzles 25 form four nozzle groups 29 (29$k$, 29$y$, 29$c$, 29$m$) corresponding to the four color inks respectively on the lower surface of the flow passage unit 20 (surface disposed on the back side of the paper surface of FIG. 2). The four nozzle groups are arranged in the scanning direction in an order of the nozzle group 29$m$ for the magenta, the nozzle group 29$c$ for the cyan, the nozzle group 29$y$ for the yellow, and the nozzle group 29$k$ for the black as referred to from one disposed on the left side as viewed in FIG. 2. The spacing distance in the scanning direction is wider between the nozzle group 29$k$ for the black and the nozzle group 29$y$ for the yellow than those between the other nozzle groups 29.

Each of the four nozzle groups 29 has four rows of nozzle rows 28 which are arranged in the scanning direction. Each of the nozzle rows 28 is composed of the plurality of nozzles 25 aligned in the transport direction. In other words, the sixteen rows of the nozzle rows 28 in total are formed for the flow passage unit 20. The nozzles 25 are aligned at alignment intervals (alignment pitches) P in the transport direction in each of the nozzle rows 28. Furthermore, the positions of the nozzles 25 in the alignment direction (transport direction) are deviated from each other among the four rows of the nozzle rows 28 for forming one nozzle group 29. The positions of the nozzles 25 are deviated by P/4 in the alignment direction (transport direction) between the nozzle rows 28 adjoining in the scanning direction (for example, the nozzle row 28$m$1 and the nozzle row 28$m$2 shown in FIG. 2). Accordingly, the nozzles 25 are aligned at alignment intervals of P/4 in the transport direction in the whole of one nozzle group 29.

The plurality of pressure chambers 26 form sixteen rows of pressure chamber rows 38 in total corresponding to the arrangement of the nozzles 25 in the four nozzle groups 29 respectively. The sixteen rows of the pressure chamber rows 38 are arranged in the scanning direction. Then, each of the pressure chamber rows 38 is composed of the plurality of pressure chambers 26 aligned in the transport direction. Furthermore, the two rows of the pressure chamber rows 38 are arranged just over one manifold 24 extending in the transport direction. The pressure chambers 26, which belong to the two rows of the pressure chamber rows 38, are communicated with the one manifold 24. The plurality of pressure chambers 26 are covered from the upward with the ink sealing film 40 which is joined to the upper surface of the plate 31.

The alignment interval of the pressure chambers 26 in the transport direction is equal to the alignment interval P of the nozzles 25 in the transport direction. Each of the pressure chambers 26 is a hole having a substantially rectangular planar shape which is long in the scanning direction. As shown in FIG. 4, one end portion in the longitudinal direction of each of the pressure chambers 26 is communicated with the manifold 24, and the other end portion in the longitudinal direction is communicated with the nozzle 25. Accordingly, as shown by an arrow in FIG. 4, the flow passage unit 20 is formed with a plurality of individual ink flow passages each of which is branched from the manifold 24 to arrive at the nozzle 25 via the pressure chamber 26. In FIGS. 4 and 5, such a state is shown that the ink indicated by the symbol I is charged in the individual ink flow passages including, for example, the manifolds 24 and the plurality of pressure chambers 26.

[Arrangement of Piezoelectric Actuator]

The piezoelectric actuator 21 is arranged on the upper surface of the ink sealing film 40 of the flow passage unit 20. As shown in FIGS. 2 to 5, the piezoelectric actuator 21 includes two piezoelectric layers 41, 42, a plurality of individual electrodes 44, and a common electrode 45. Furthermore, in the piezoelectric actuator 21 of this embodiment, a first conductive pattern 51 and second conductive patterns 52 are provided on the upper surface of the piezoelectric layer 41.

Each of the two piezoelectric layers 41, 42 is composed of a piezoelectric material. Lead zirconate titanate, which is a mixed crystal of lead titanate and lead zirconate, can be adopted as the piezoelectric material for forming the piezoelectric layer 41, 42. Alternatively, it is also possible to adopt barium titanate as a piezoelectric material containing no lead and a niobium-based piezoelectric material. The piezoelectric layers 41, 42 are arranged on the upper surface of the ink sealing film 40 in a state of being mutually stacked. Furthermore, the lower piezoelectric layer 42 is joined to the ink sealing film 40 by using an adhesive 37.

The plurality of individual electrodes 44 are formed on the upper surface of the piezoelectric layer 41 on the side opposite to the piezoelectric layer 42. The plurality of individual electrodes 44 correspond to the plurality of pressure chambers 26 of the flow passage unit 20 respectively to form sixteen rows of individual electrode rows 50 in total. The sixteen rows of the individual electrode rows 50 are arranged in the scanning direction. Then, each of the individual electrode rows 50 is composed of the plurality of individual electrodes 44 aligned in the transport direction. The alignment interval of the individual electrode 44 in the transport direction is equal to the alignment interval P of the nozzle 25 and the pressure chamber 26. Each of the individual electrodes 44 has a substantially elliptic planar shape which is long in the scanning direction, and each of the individual electrodes 44 is opposed to the central portion of the corresponding pressure chamber 26. A connecting terminal 46 is provided at one end portion in the longitudinal direction of each of the individual electrodes 44. The connecting terminal 46 extends to the area which is not opposed to the pressure chamber 26, in the scanning direction from the one end portion of the individual electrode 44 on the upper surface of the piezoelectric layer 41.

A conductive bump 53 is provided at an end portion of the connecting terminal 46. As shown in FIG. 4, COF 63, which is a wiring member, is pressed against and joined to the bump 53. Accordingly, the individual electrode 44 is electrically connected to COF 63 by the bump 53. COF 63 is connected to the control unit 6 of the printer 1 (see FIG. 1). Furthermore, COF 63 is provided with an unillustrated driver IC. The driver IC switches the electric potential of each of the individual electrodes 44 between a predetermined driving electric potential and the ground electric potential on the basis of a discharge control signal supplied from the control unit 6.

The common electrode 45 is arranged on the substantially entire surface between the two piezoelectric layers 41, 42. Furthermore, the common electrode 45 is opposed to the plurality of individual electrodes 44 respectively while interposing the upper piezoelectric layer 41 therebetween.

As shown in FIGS. 2 and 3, the first conductive pattern 51 is formed in the area disposed on the outer side of the upper surface of the upper piezoelectric layer 41 as compared with the plurality of individual electrodes 44 (in the area disposed nearer to the edge of the upper surface of the piezoelectric layer 41 as compared with the plurality of individual electrodes 44). More specifically, the first conductive pattern 51 is formed on the entire circumference of the edge portion of the upper surface of the upper piezoelectric layer 41 to surround the area in which the plurality of individual electrodes 44 are arranged. The first conductive pattern 51 includes two first portions 51a which are arranged on the both sides in the transport direction with respect to the plurality of individual electrodes 44, and two second portions 51b which are arranged on the both sides in the scanning direction with respect to the plurality of individual electrodes 44.

As shown in FIGS. 2, 3, and 5, a plurality of through-holes 41a, which penetrate through the piezoelectric layer 41, are formed in the area of the upper surface of the piezoelectric layer 41 in which the first portions 51a of the first conductive pattern 51 are formed. Each of the through-holes 41a is filled with a conductive material to form a conducting portion 55. The common electrode 45, which is arranged between the two piezoelectric layers 41, 42, is in conduction with the first conductive pattern 51 by the conducting portions 55 disposed in the plurality of through-holes 41a. Furthermore, as shown in FIGS. 2 and 3, a plurality of bumps 54 are arranged on the two first portions 51a and the two second portions 51b of the first conductive pattern 51. COF 63 is pressed against and joined to the bumps 54. According to the above, the common electrode 45 is electrically connected to the ground wiring (not shown) formed on COF 63, and the common electrode 45 is always maintained at the ground electric potential.

When the piezoelectric actuator 21 is joined to the flow passage unit 20 by using the adhesive 37, any excessive adhesive 37 climbs up to the upper surface from the circumferential edge of the piezoelectric layer 41, 42 in some cases. In relation to this point, in the embodiment of the present teaching, the first conductive pattern 51 is formed to surround the plurality of individual electrodes 44. Therefore, the adhesive 37, which climbs up to the upper surface of the piezoelectric layer 41, is reliably prevented by the first conductive patterns 51 from flowing into the plurality of individual electrodes 44.

The portion of the piezoelectric layer 41, which is interposed between the individual electrode 44 and the common electrode 45 as shown in FIG. 4, is especially referred to as "active portion 43". The active portion 43 is polarized in the downward direction in the thickness direction, i.e., in the direction directed from the individual electrode 44 to the common electrode 45.

As shown in FIG. 2, a vacant area also exists between the individual electrode row 50 for the black and the individual electrode row 50 for the yellow on the upper surface of the piezoelectric layer 41 corresponding to the fact that the spacing distance is large between the nozzle group 29 for the black and the nozzle group 29 for the yellow of the flow passage unit 20. An inspection pattern 56 is formed in this area in order to measure the resonance frequency of the piezoelectric actuator 21.

The inspection pattern 56 has a plurality of inspection electrodes 58 which are aligned in the transport direction, and a plurality of pads 57 which are in conduction with the plurality of inspection electrodes 58 respectively. The plurality of inspection electrodes 58 are opposed to the common electrode 45 while interposing the piezoelectric layer 41 therebetween. A probe (not shown) is allowed to abut against each of the pads 57 to apply a voltage to the inspection electrode 58, and the frequency of the applied voltage is changed. Based on the change of the output current value of the common electrode 45 provided in this situation, it is possible to measure the resonance frequency of the piezoelectric actuator 21 at the portion at which the inspection electrode 58 is provided. Dummy inspection electrodes 60 are arranged on the both sides in the transport direction of each of the inspection electrodes 58. Furthermore, dummy pads 59 are also arranged on the both sides in the transport direction of each of the pads 57.

The operation of the piezoelectric actuator 21, which is performed when the inks are discharged from the nozzles 25, is as follows. The electric potential of a certain individual electrode 44 is switched from the ground electric potential to the driving electric potential by the driver IC mounted on COF 63. In this situation, the electric potential difference arises between the individual electrode 44 and the common electrode 45 which is retained at the ground electric potential. Accordingly, the electric field in the thickness direction arises in the active portion 43 of the piezoelectric layer 41 shown in FIG. 4. Furthermore, the polarization direction of the active portion 43 is coincident with the direction of the electric field. Therefore, the active portion 43 is elongated in the thickness direction which is the polarization direction thereof, and the active portion 43 is shrunk in the surface direction. In accordance with the shrinkage deformation of the active portion 43, the two piezoelectric layers 41, 42 are warped or flexibly bent so that they protrude toward the side of the pressure chamber 26. Accordingly, the volume of the pressure chamber 26 is decreased, and the pressure is applied to the ink contained therein. The liquid droplets of the ink are discharged from the nozzle 25 communicated with the pressure chamber 26.

In addition to the arrangement as described above, as shown in FIGS. 2 and 3, the two second conductive patterns 52, which extend in the scanning direction, are further formed in the areas of the upper surface of the piezoelectric layer 41 between the plurality of individual electrodes 44 and the two first portions 51a of the first conductive pattern 51.

[Details of Second Conductive Pattern]

Each of the second conductive patterns 52 has a plurality of dummy electrode portions 61 which are arranged in the scanning direction, and a plurality of connecting portions 62 which connect the plurality of dummy electrode portions 61. As described above, the sixteen rows of the individual electrode rows 50 in total, which are arranged in the scanning direction, are formed on the upper surface of the piezoelectric layer 41. The two dummy electrode portions 61 are arranged respectively on the upstream side and the downstream side in the transport direction of each of the individual electrode rows 50. That is, the dummy electrode portion 61 is arranged on the further upstream side in the transport direction of the individual electrode 44 (row-end electrode 44) which is positioned at the alignment end (row end) on the upstream side in the transport direction of each of the individual electrode rows 50. The dummy electrode portion 61 is aligned with row-end electrode 44 on the upstream side in the transport direction. Furthermore, the dummy electrode portion 61 is arranged on the further downstream side in the transport direction of the individual electrode 44 (row-end electrode 44) which is positioned at the alignment end (row end) on the downstream side in the transport direction of each of the individual electrode rows 50. The dummy electrode portion 61 is aligned with row-end electrode 44 on the downstream side in the transport direction. The dummy electrode portion 61 is the electrode which does not contribute to the discharge of the ink from the nozzle 25. Specifically, unlike the individual electrode 44, the dummy electrode portion 61 is not connected to COF 63 which is the wiring member, and the driving electric potential is not applied to the dummy electrode portion 61. It is also allowable that a dummy pressure chamber (pressure chamber which does not contribute to the discharge of the ink) is arranged at a position of the flow passage unit 20 disposed just under the dummy electrode portion 61, for example, in order to uniformize the characteristic of the pressure chamber 26 (for example, the rigidity of the surrounding of the pressure chamber 26) between the pressure chamber 26 disposed at the end and the pressure chamber 26 disposed on the central side of the pressure chamber row 38. Furthermore, it is also allowable that the flow passage unit 20 is formed with a flow passage which includes a dummy nozzle communicated with the dummy pressure chamber. It is not necessarily indispensable to provide the flow passage including, for example, the dummy pressure chamber as described above. It is also allowable that any flow passage, which corresponds to the dummy electrode portion 61, is not formed at all for the flow passage unit 20.

As shown in FIGS. 2 and 3, the sixteen dummy electrode portions 61, which are arranged on the upstream side of the sixteen rows of the individual electrode rows 50 in the transport direction, are connected each other by the connecting portions 62, and thus the second conductive pattern 52 is constructed. Similarly, the sixteen dummy electrode portions 61, which are arranged on the downstream side of the sixteen rows of the individual electrode rows 50 in the transport direction, are connected each other by the connecting portions 62, and thus the second conductive pattern 52 is constructed.

The connecting portion 62 connects the end portions of the two adjoining dummy electrode portions 61 to one another in a form of straight line. As shown in FIG. 3, the two individual electrode rows 50 adjoining in the scanning direction are deviated from each other in the transport direction. Therefore, the positions in the transport direction of the two respective corresponding dummy electrode portions 61 are also deviated from each other. Therefore, the connecting portion 62, which connects the two adjoining dummy electrode portions 61, extends in the direction which is inclined against the scanning direction.

The reason, why the second conductive pattern 52 is provided for the piezoelectric layer 41, closely relates to the production steps of producing the ink jet head 4. Therefore, a brief explanation will be firstly made about the production steps of producing the ink jet head 4.

[Production Step of Producing Flow Passage Unit]

As for the four plates 31 to 34 which are disposed on the upper side and which are included in the five plates 31 to 35 of the flow passage unit 20, the etching is performed for each of them to form the flow passage holes, for example, for the pressure chambers 26 and the manifolds 24 respectively. Furthermore, the plurality of nozzles 25 are formed for the nozzle plate 35 by, for example, the laser processing. Then, the ink sealing film 40 is superimposed on the plates 31 to 35, and they are joined to one another by using the adhesive.

[Production Step of Producing Piezoelectric Actuator]

Two uncalcined (unsintered) green sheets are prepared. The plurality of individual electrodes 44 are formed on the surface of one of the green sheets, and the common electrode 45 is formed on the surface of the other green sheet. The two green sheets are stacked so that the common electrode 45 is interposed therebetween, and then the two green sheets are heated and calcined (sintered) at a predetermined temperature to obtain a stack of the two piezoelectric layers 41, 42.

[Joining Step]

The piezoelectric actuator 21 described above is joined to the flow passage unit 20. That is, the two piezoelectric layers 41, 42 are joined to the upper surface of the ink sealing film 40 of the flow passage unit 20 by using the adhesive 37.

An explanation will be made about the reason why the dummy electrode portion 61 and the connecting portion 62 of the second conductive pattern 52 are provided for the piezoelectric layer 41 in the embodiment of the present teaching.

(1) Elimination of Difference in Characteristic Between Active Portions 43

The pressure chamber 26, which is positioned at the row end and which is included in the plurality of pressure chambers 26 for forming one row of the pressure chamber row 38, has only one side in the alignment direction (transport direction) thereof on which another pressure chamber 26 is adjoined. In other words, the two individual electrodes 44, which correspond to the two pressure chambers 26, are present on the both sides of the active portion 43 which corresponds to the pressure chamber 26 positioned on the central side, while only one individual electrode 44 is arranged adjacently to the active portion 43 which corresponds to the pressure chamber 26 disposed at the end.

In this case, the condition of the thermal shrinkage or the like around the active portion 43 differs during the calcination of the piezoelectric layers 41, 42 between the active portion 43 for which the two individual electrodes 44 are arranged on the both sides and the active portion 43 for which only one individual electrode 44 is arranged on one side. For this reason, the degree of the residual stress of the active portion 43 differs between the active portion 43 disposed at the end and the active portions 43 other than the above, and the difference appears in the characteristic of the active portion 43. In relation thereto, as shown in FIGS. 2 and 3, the dummy electrode portion 61 is arranged so that the dummy electrode portion 61 is aligned, in the transport direction as the alignment direction of the individual electrodes 44, with the individual electrode 44 which is positioned at the end of each of the individual electrode rows 50, and thus the individual electrode 44 and the dummy electrode portion 61 are arranged on the both sides of the active portion 43 disposed at the end. Accordingly, it is possible to decrease the difference in characteristic between the active portion 43 disposed at the end and the active portion 43 disposed on the central side.

Furthermore, as shown in FIG. 3, in the embodiment of the present teaching, each of the dummy electrode portions 61 has the same shape as that of the individual electrode 44. The phrase "the dummy electrode portion 61 has the same shape as that of the individual electrode 44" means that the planar shape of the dummy electrode portion 61 is the same as at least the planar shapes of the portions of the individual electrode 44 and the connecting terminal 46 opposed to the pressure chamber 26. Moreover, as shown in FIG. 3, the separation distance in the transport direction (alignment direction of the individual electrodes 44) between the dummy electrode portion 61 and the individual electrode 44 positioned at the row end of each of the individual electrode rows 50 is equal to the alignment interval P of the individual electrodes 44 in the individual electrode row 50. Therefore, the thermal shrinkage condition during the calcination of the piezoelectric layer 41, which is provided for the active portion 43 positioned at the end, can be approximated to that provided for the other active portions 43. The difference in characteristic between the both is more decreased.

(2) Blocking of Outflow of Adhesive from Through-Hole 41a to Individual Electrode 44

As shown in FIG. 5, any crack 65 is formed with ease at the portion of the lower piezoelectric layer 42 overlapped with the through-hole 41a of the upper piezoelectric layer 41 as compared with the other portions of the piezoelectric layer 42, for example, because the thickness is locally thin and the strength is weak, or the stress concentration occurs with ease. Furthermore, the piezoelectric layers 41, 42 of the piezoelectric actuator 21 are joined to the ink sealing film 40 of the flow passage unit 20 by using the adhesive 37. During the adhesion or bonding therebetween, it is feared that the adhesive 37 may permeate into the crack 65 formed at the position of the piezoelectric layer 42 just under the through-hole 41a, the adhesive 37 may overflow from the through-hole 41a, and the adhesive 37 may exude to the upper surface of the piezoelectric layer 41.

In the embodiment of the present teaching, the second conductive pattern 52, which includes the plurality of dummy electrode portions 61 arranged in the scanning direction, is arranged in the area of the upper surface of the piezoelectric layer 41 between the plurality of individual electrodes 44 and the through-hole 41a. Accordingly, even when the adhesive 37, which permeates into the crack 65, overflows to the outside of the through-hole 41a, the adhesive 37 is prevented from being spread to the individual electrode 44 by the second conductive pattern 52. Furthermore, the plurality of dummy electrode portions 61 are connected and coupled by the connecting portions 62. Therefore, the second conductive pattern 52 is the pattern which is continuous in the scanning direction. Therefore, the adhesive 37, which overflows from the through-hole 41a, is reliably prevented from flowing out to the plurality of individual electrodes 44.

Even when the shape of the individual electrode 44 is the same as that of the dummy electrode portion 61, if the individual electrode 44 and the dummy electrode portion 61, which are positioned on the both sides of the active portion 43 positioned at the end, are compared with each other, then the electrode area (areal size) of the dummy electrode portion 61 is larger a little by the amount of the provision of the connecting portion 62 for the dummy electrode portion 61. Therefore, in view of the fact that the thermal shrinkage condition is approximated as closely as possible between the active portion 43 disposed at the end and the other active portions 43, it is preferable that the areal size of the connecting portion 62 is made as small as possible. Accordingly, as shown in FIG. 3, the width W of the connecting portion 62 in the transport direction is smaller than the width of the dummy electrode portion 61.

Other than the features as described above, in the embodiment of the present teaching, the following characteristic features are additionally provided in relation to the second conductive pattern 52.

(a) As shown in FIGS. 2 and 3, in the embodiment of the present teaching, the positions of the nozzles 25 are deviated from each other in the alignment direction (transport direction) between the nozzle rows 28 which are adjacent to one another in the scanning direction. For this reason, the positions of the individual electrodes 44 in the alignment direction (transport direction) are also deviated from each other between the individual electrode rows 50 which are adjacent to one another in the scanning direction. Therefore, the position in the transport direction also differs between the dummy electrode portions 61 which are adjacent to one another in the scanning direction.

More specifically, the central individual electrode row 50B, which is included in the three rows of the individual electrode rows 50A, 50B, and 50C arranged in the scanning direction as shown in FIG. 3, is deviated in the transport direction to the side (upstream side in the transport direction) opposite to the first portion 51a of the first conductive pattern 51 with respect to the individual electrode rows 50A and 50C disposed on the both sides thereof. Therefore, the central dummy electrode portion 61B, which corresponds to the central individual electrode row 50B, is also deviated to the side (upstream side in the transport direction) opposite to the first portion 51a of the first conductive pattern 51 with respect to the two dummy electrode portions 61A, 61C disposed on the both sides corresponding to the two individual electrode rows 50A, 50C disposed on the both sides respectively. That is, the individual electrode 44 (row-end electrode 44), which is positioned at the row end of the central individual electrode row 50B, is arranged at the position separated farther from the first conductive pattern 51 in the transport direction as compared with the individual electrodes 44 (row-end electrodes 44) which are positioned at the row ends of the individual electrode rows 50A and 50C disposed on the both sides thereof. Then, similarly, the central dummy electrode portion 61B, which is arranged to be aligned with the row-end electrode 44 of the central individual electrode row 50B, is arranged at the position separated farther from the first conductive pattern 51 in the transport direction as compared with the two dummy electrode portions 61A, 61C disposed on the both sides which are arranged to be aligned with the row-end electrodes 44 of the individual electrode rows 50A and 50C disposed on the both sides thereof respectively.

On this assumption, the through-hole 41a is arranged at the position aligned with the central dummy electrode portion 61B in the transport direction in the area of the upper surface of the piezoelectric layer 41 in which the first portion 51a of the first conductive pattern 51 is formed. On the other hand, any through-hole 41a is not arranged at the positions aligned with the two dummy electrode portions 61A, 61C disposed on the both sides.

In other words, the through-hole 41a, which is arranged at the first portion 51a of the first conductive pattern 51, is aligned in the transport direction with the central dummy electrode portion 61B which is separated farthest from the first portion 51a. Accordingly, the distances are increased from the through-hole 41a to the three dummy electrode portions 61A, 61B, 61C. The adhesive 37, which overflows from the through-hole 41a, hardly climbs over the dummy electrode portion 61. Furthermore, the adhesive 37, which overflows from the through-hole 41a, can be accumulated in the area surrounded by the three dummy electrode portions 61A, 61B, 61C.

(b) As shown in FIGS. 2 and 3, spaces 66 are formed between the both end portions in the scanning direction of the second conductive pattern 52 and the two second portions 51b of the first conductive pattern 51. In other words, the second conductive pattern 52 is not connected to the first conductive pattern 51. As described above, the electric potential of the individual electrode 44 is switched by the driver IC between the driving electric potential and the ground electric potential. If the second conductive pattern 52 is a pattern which is in conduction with the first conductive pattern 51, if any short circuit or the like is formed between the individual electrode 44 and the second conductive pattern 52 and the both are in conduction, then it is feared that a large current may flow via the second conductive pattern 52 between the individual electrode 44 and the first conductive pattern 51 at the ground electric potential. In relation to this point, in the embodiment of the present teaching, the second conductive pattern 52 is not connected to the first conductive pattern 51. Therefore, the problem as described above is not caused.

(c) If the space 66 exists between the end portion of the second conductive pattern 52 and the second portion 51b of the first conductive pattern 51, it is assumed that the adhesive 37, which overflows from the through-hole 41a, flows out from the space 66 toward the individual electrode 44. In view of the above, it is preferable to provide such an arrangement that the adhesive 37 hardly outflows from the through-hole 41a to the space 66.

In the embodiment of the present teaching, the through-holes 41a formed at the upper-right portion and the lower-left portion as viewed in FIG. 2, which are included in the plurality of through-holes 41a formed in the piezoelectric layer 41, are disposed at the positions nearer to the spaces 66 than the other through-holes 41a. In particular, as for the through-hole 41a formed at the lower-left portion as viewed in FIG. 2, the peripheral configuration thereof is depicted in detail in FIG. 3. Therefore, an explanation will be made with reference to FIG. 3. The through-hole 41a is aligned with one dummy electrode portion 61B in the transport direction. Furthermore, two dummy electrode portions 61A, 61C are arranged on the both sides in the scanning direction of the dummy electrode portion 61B. Namely, the two dummy electrode portions 61A, 61C are positioned on the both sides in the scanning direction with respect to the through-hole 41a. The separation distance A is provided between the first portion 51a of the first conductive pattern 51 and the dummy electrode portion 61A disposed nearer to the space 66 than the dummy electrode portions 61C. The separation distance C is provided between the first portion 51a of the first conductive pattern 51 and the dummy electrode portion 61C which is separated farther from the space 66 than the dummy electrode portion 61A. The separation distance A is smaller than the separation distance C.

Accordingly, if the adhesive 37 overflows from the through-hole 41a disposed nearest to the space 66, the adhesive 37 easily flows to the side of the dummy electrode portion 61C having the distance separated farther from the first portion 51a of the first conductive pattern 51, i.e., to the side opposite to the space 66. Accordingly, the adhesive 37 hardly flows out from the space 66 toward the individual electrode 44.

(d) As shown in FIG. 2, an inspection pattern 56, which is composed of a plurality of inspection electrodes 58 and a plurality of pads 57 to measure the resonance frequency, is formed on the upper surface of the piezoelectric layer 41. Two dummy inspection electrodes 60 are arranged on the both sides of the respective inspection electrodes 58, and two dummy pads 59 are also arranged on the both sides of the respective pads 57. Owing to the arrangement of the two dummy inspection electrodes 60 on the both sides of the inspection electrodes 58, the condition of thermal shrinkage can be made equivalent on the both sides of the inspection electrodes 58 during the calcination of the piezoelectric layers 41, 42, and the characteristic of the piezoelectric layer portion can be made equivalent among the plurality of inspection electrodes 58 at positions disposed just thereunder respectively. The reason, why the dummy pad 59 is provided, is the same as or equivalent to that for the dummy inspection electrode 60.

In this arrangement, if the distance is small between the second conductive pattern 52 and the dummy inspection electrode 60 (or the dummy pad 59) positioned at the end in the transport direction of the inspection pattern 56, then the characteristic of the piezoelectric layer portion differs between the inspection electrode 58 (or the pad 57) positioned at the end and the other inspection electrode 58 (or the pad 57), at the positions disposed just thereunder, and it is impossible to accurately measure the resonance frequency. In view of the above, in the embodiment of the present teaching, as shown in FIG. 2, the separation distance d in the transport direction between the second conductive pattern 52 and the dummy inspection electrode 60 or between the second conductive pattern 52 and the dummy pad 59 is larger than the separation distance (pitch P) in the transport direction between the individual electrode 44 and the dummy electrode portion 61.

In the embodiment explained above, the ink-jet head 4 corresponds to the liquid discharge apparatus of the present teaching. The flow passage unit 20 corresponds to the flow passage structure of the present teaching. The upper piezoelectric layer 41 corresponds to the first piezoelectric layer of the present teaching. The lower piezoelectric layer 42, which is arranged to be overlapped on the side of the flow passage unit 20 of the piezoelectric layer 41, corresponds to the second piezoelectric layer of the present teaching. The individual electrode 44 corresponds to the first electrode of the present teaching. The common electrode 45 corresponds to the second electrode of the present teaching. The transport direction corresponds to the first direction of the present teaching. The scanning direction corresponds to the second direction of the present teaching.

Next, an explanation will be made about modified embodiments (i) to (viii) in which various modifications are applied to the embodiment described above. However, those constructed in the same manner as those of the embodiment described above are designated with the same reference numerals, any explanation of which will be appropriately omitted.

Figure 6:
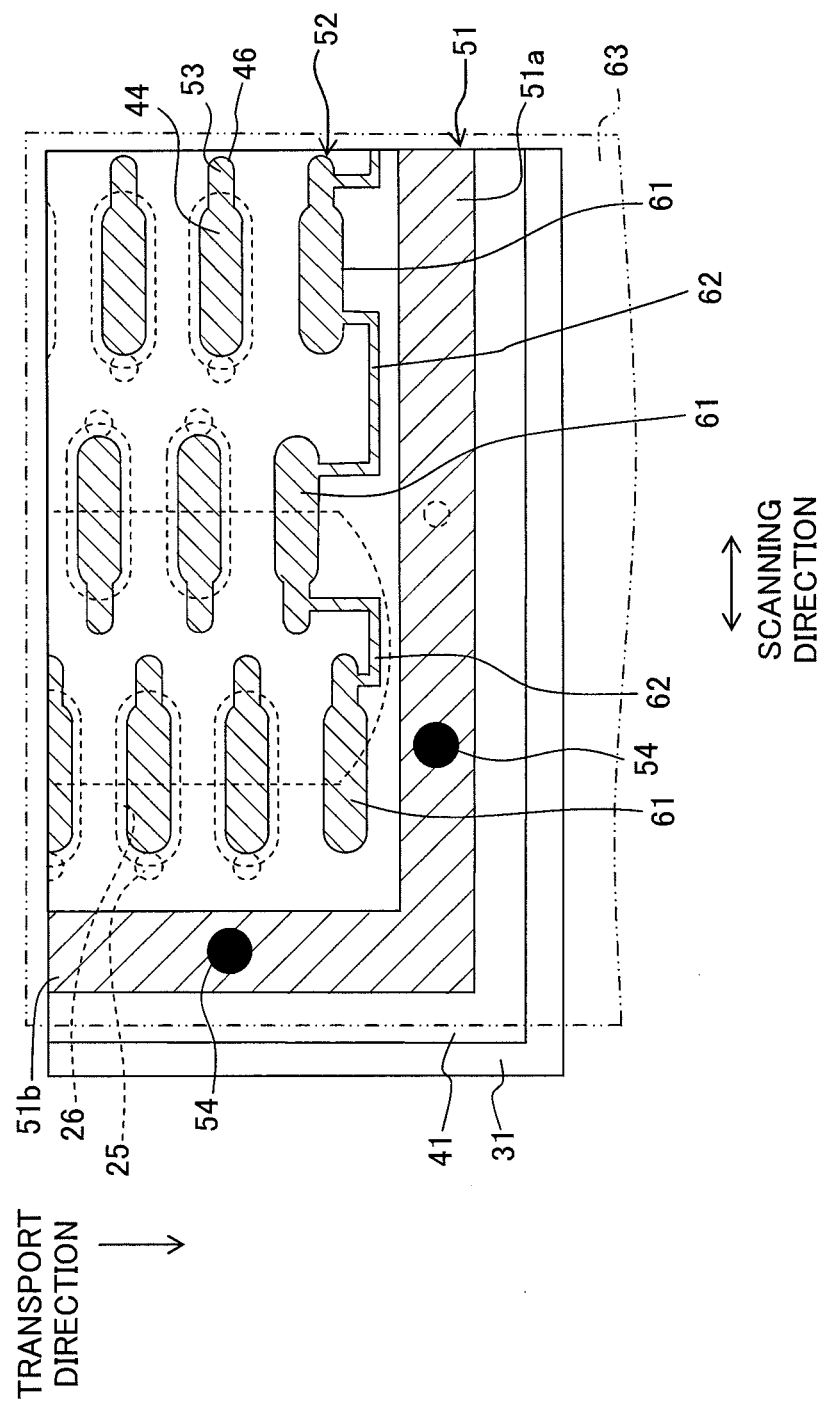
FIG. 6 shows an enlarged plan view illustrating a part of an ink jet head according to modified embodiment (i).

(i) It is possible to appropriately change, for example, the shape and the arrangement of the connecting portion 62 for connecting the plurality of dummy electrode portions 61. For example, the presence of the connecting portion 62 affects the characteristic of the active portion 43 corresponding to the pressure chamber 26 disposed at the end. Therefore, it is preferable that the connecting portion 62 is disposed at the position separated from the pressure chamber 26 disposed at the end. In view of the above, as shown in FIG. 6, it is also appropriate that the connecting portion 62 is arranged on the side opposite to the individual electrode 44 with respect to the dummy electrode portion 61.

Figure 7:
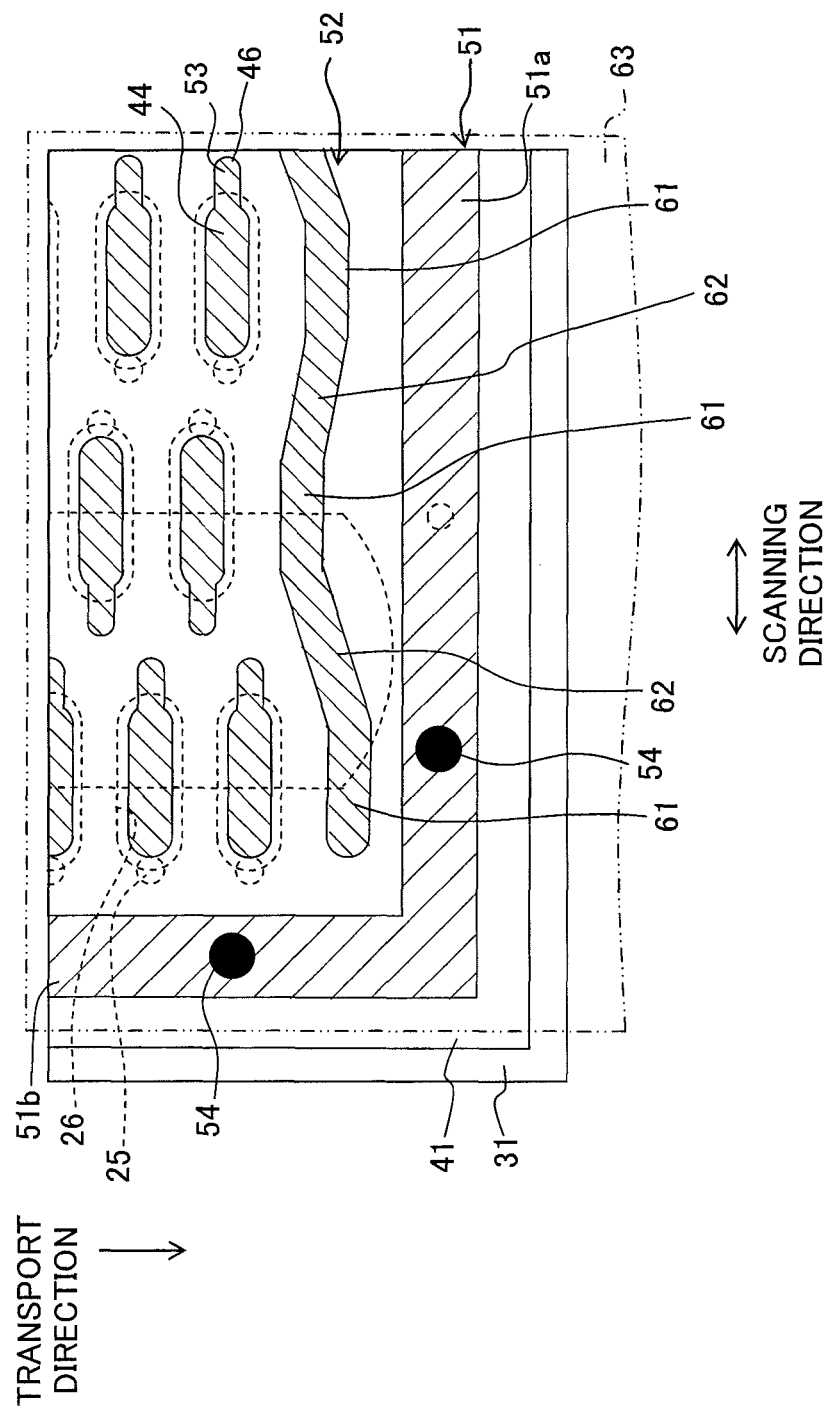
FIG. 7 shows an enlarged plan view illustrating a part of an ink jet head according to another example of modified embodiment (i).

Furthermore, as shown in FIG. 7, it is also appropriate that the width in the transport direction of the connecting portion 62 is approximately the same as the width of the dummy electrode portion 61. Although not shown, it is also appropriate that the plurality of dummy electrode portions 61 are not connected, and the second conductive pattern 52 is constructed by only the plurality of dummy electrode portions 61 which are arranged while providing spacing distances in the scanning direction.

Figure 8:
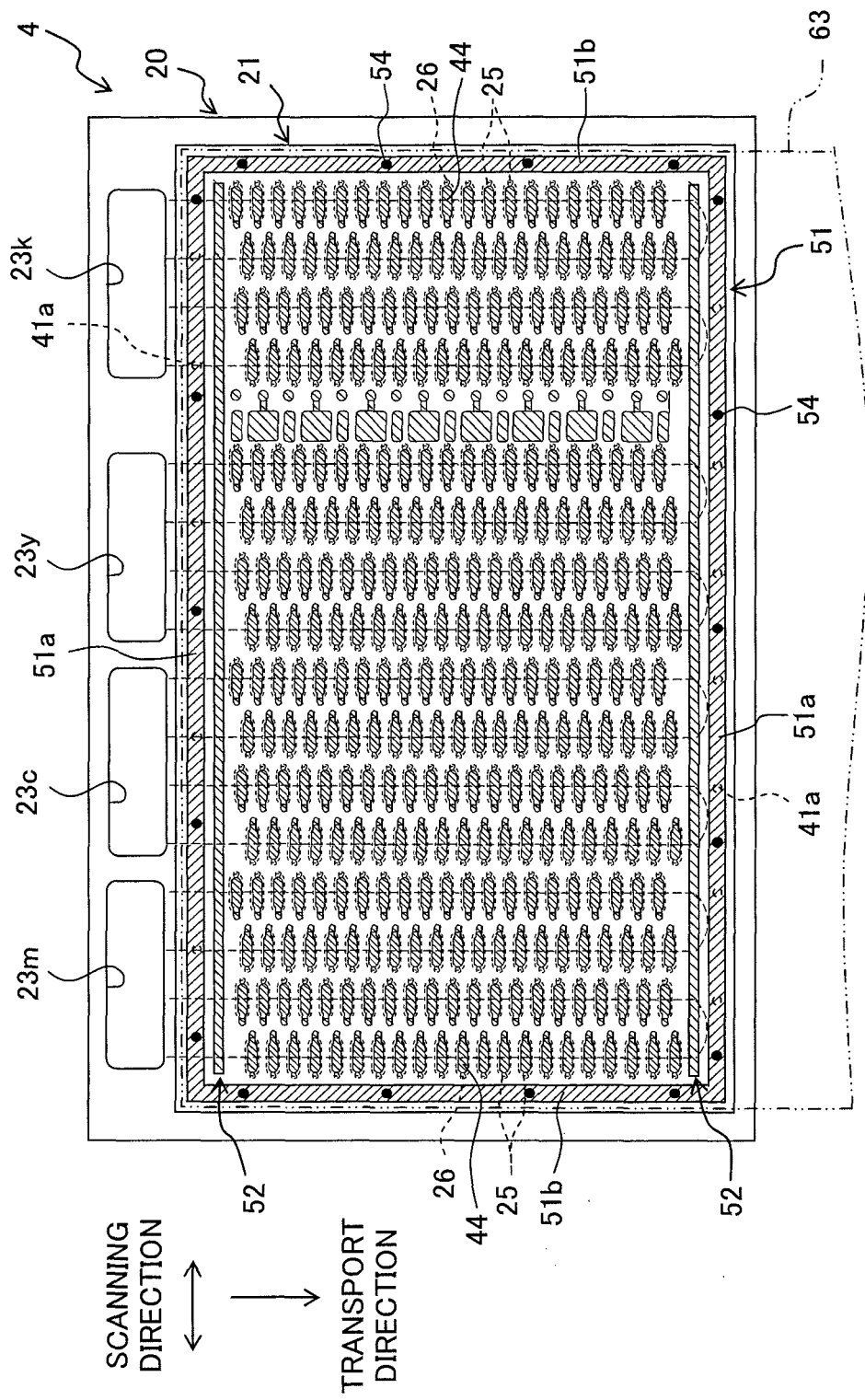
FIG. 8 shows a plan view illustrating an ink jet head according to modified embodiment (ii).

(ii) In the embodiment described above, the plurality of dummy electrode portions 61, which are provided for the plurality of individual electrode rows 50 respectively, also serve as the second conductive pattern which blocks the outflow of the adhesive 37 allowed to overflow from the through-hole 41a to the individual electrode 44. In contrast thereto, it is also appropriate that any second conductive pattern is provided irrelevant to the dummy electrode portion. For example, as shown in FIG. 8, it is also appropriate that second conductive patterns 52, each of which extends in the scanning direction in a form of straight line, are formed in place of the plurality of dummy electrode portions 61. Even in the case of the arrangement in which the plurality of dummy electrode portions 61 are provided, it is also appropriate that the second conductive pattern 52 is formed distinctly from the plurality of dummy electrode portions 61.

(iii) In the embodiment described above, the second conductive pattern 52 is not connected to the first conductive pattern 51. However, it is also appropriate that the second conductive pattern 52 is in conduction with the first conductive pattern 51 and the second conductive pattern 52 has the same electric potential as that of the first conductive pattern 51.

Figure 9:
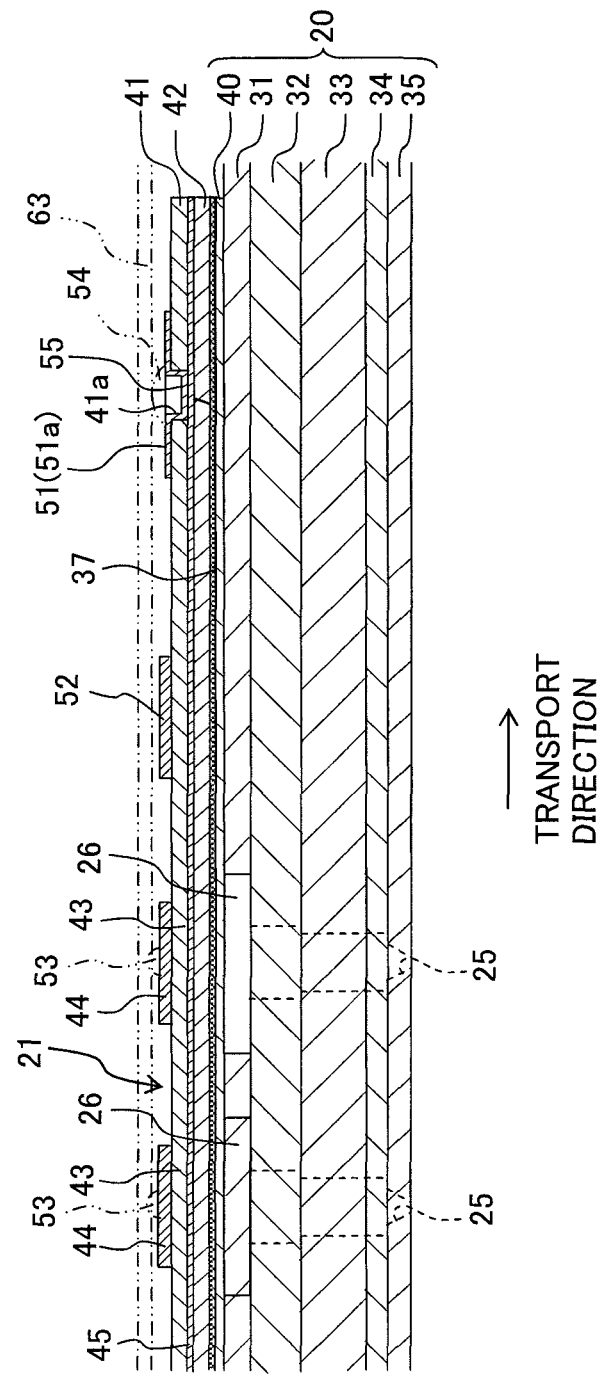
FIG. 9 shows a sectional view illustrating a part of an ink-jet head according to modified embodiment (iv).

(iv) As shown in FIG. 9, it is also appropriate that the thickness of the second conductive pattern 52 is larger than the thickness of the first conductive pattern 51. In this case, even when the adhesive 37 overflows from the through-hole 41a, it is difficult for the adhesive 37 to climb over the second conductive pattern 52.

Figure 10:
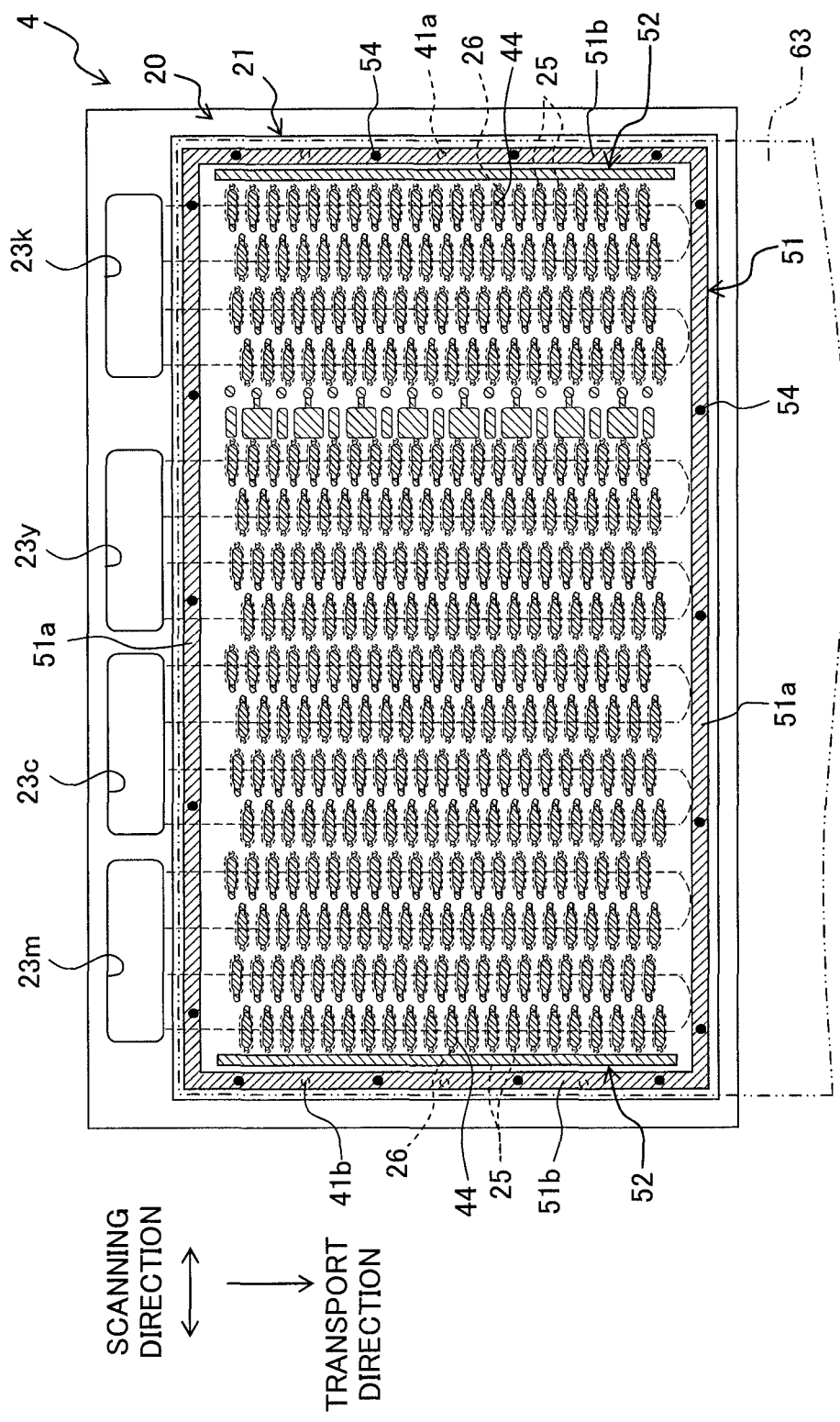
FIG. 10 shows a plan view illustrating an ink-jet head according to modified embodiment (v).

(v) As shown in FIG. 10, it is also appropriate that through-holes 41a are arranged in areas in the second portions 51b of the first conductive pattern 51, the areas being positioned on the outer sides in the scanning direction with respect to the plurality of individual electrodes 44 (positioned nearer to the edges of the upper surface of the piezoelectric layer 41 as compared with the plurality of individual electrodes 44). It is enough that the second conductive patterns 52 are arranged at least between the through-holes 41a and the individual electrodes 44, and the arrangement may be appropriately changed depending on the positions at which the through-holes 41a are formed. In the case of the arrangement shown in FIG. 10, in order that the adhesive 37, which overflows from the through-holes 41a positioned on the both sides in the scanning direction with respect to the individual electrodes 44, is prevented from flowing out toward the individual electrodes 44, the second conductive patterns 52 are arranged in the areas of the upper surface of the piezoelectric layer 41 between the plurality of individual electrodes 44 and the second portions 51b of the first conductive pattern 51 in the scanning direction.

(vi) In the embodiment described above, as shown in FIG. 2, the first conductive pattern 51 has the two first portions 51a which are disposed on the both sides in the transport direction, and the two second portions 51b which are disposed on the both sides in the scanning direction, with respect to the plurality of individual electrodes 44. However, there is no limitation thereto. In particular, if the climbing of the adhesive 37 from the edge portion of the piezoelectric layer 41, which is brought about when the piezoelectric actuator 21 is joined to the flow passage unit 20, does not cause any serious problem, then it is enough that the first conductive pattern 51 is formed at the position at which the conduction can be made with the common electrode 45 and COF 63, and it is not necessarily indispensable that the first conductive pattern 51 is provided to surround the plurality of individual electrodes 44. For example, it is also allowable that the first portion 51a is provided on only one side in the transport direction, or the second portion 51b is provided on only one side in the scanning direction. Furthermore, it is also allowable that one of the first portion 51a and the second portion 51b is omitted.

Furthermore, it is not necessarily indispensable that the first conductive pattern 51 extends continuously in the scanning direction or in the transport direction. It is also allowable that the first conductive pattern 51 is divided into a plurality of pieces in the scanning direction or in the transport direction.

(vii) The number of stacked layers of the piezoelectric layers of the piezoelectric actuator is not limited to two. It is also possible to apply the present teaching to any piezoelectric actuator in which three or more piezoelectric layers are stacked.

(viii) In the embodiment described above, as shown in FIG. 2, the two dummy electrode portions 61 are arranged respectively on the both sides of the upstream side and the downstream side in the transport direction of the respective individual electrode rows 50. On the contrary, it is also allowable that the dummy electrode portion 61 is arranged on only any one side of the upstream side and the downstream side of in the transport direction the respective individual electrode rows 50.

As explained above, in the embodiment and the modified embodiments, the second electrode (common electrode 45), which is arranged between the first piezoelectric layer (upper piezoelectric layer 41) and the second piezoelectric layer (lower piezoelectric layer 42), is connected to the first conductive pattern 51 formed on the first piezoelectric layer (upper piezoelectric layer 41) by the conducting portion 55 in the through-hole 41a formed through the first piezoelectric layer (upper piezoelectric layer 41). In this arrangement, any crack tends to appear at the portion of the second piezoelectric layer (lower piezoelectric layer 42) overlapped with the through-hole 41a of the first piezoelectric layer (upper piezoelectric layer 41). If the crack appears, any excessive adhesive permeates into the crack when the piezoelectric actuator 21 is joined to the flow passage structure (flow passage unit 20) by using the adhesive 37. Furthermore, it is feared that the adhesive may overflow from the through-hole 41a, and the adhesive may flow out to the surface of the first piezoelectric layer (upper piezoelectric layer 41) on which the first electrode (individual electrode 44) is formed. In relation thereto, in the present teaching, the second conductive pattern 52 is arranged in the area of the first piezoelectric layer (upper piezoelectric layer 41) between the through-hole 41a and the plurality of first electrodes (individual electrodes 44). Accordingly, even if the adhesive, which permeates into the crack formed in the second piezoelectric layer (lower piezoelectric layer 42), overflows from the through-hole 41a, the adhesive is prevented from being spread to the first electrode (individual electrode 44) by the second conductive pattern 52.

In the foregoing embodiment and the modified embodiments thereof explained above, the present teaching is applied to the ink-jet head with which the inks are discharged onto the recording paper to print the image or the like. However, the present teaching is also applicable to any liquid discharge apparatus to be used for various ways of use other than the way of use for printing the image or the like. For example, the present teaching can be also applied to a liquid discharge apparatus in which a conductive liquid is jetted onto a substrate to form a conductive pattern on a substrate surface. Furthermore, the piezoelectric actuator of the present teaching is not limited to those usable for the way of use of the liquid discharge. The present teaching is also applicable to any piezoelectric actuator usable for any way of use other than the above.

What is claimed is:

1. A liquid discharge apparatus comprising:
a flow passage structure which is formed with liquid flow passages including a plurality of nozzles and a plurality of pressure chambers communicated with the plurality of nozzles respectively; and
a piezoelectric actuator which is joined to the flow passage structure, the piezoelectric actuator including:
a first piezoelectric layer which covers the plurality of pressure chambers;
a second piezoelectric layer which covers the plurality of pressure chambers and which is arranged to be overlapped on a flow passage structure side of the first piezoelectric layer;
a plurality of first electrodes which are arranged on a surface of the first piezoelectric layer on a side opposite to the second piezoelectric layer and which are opposed to the plurality of pressure chambers respectively;
a second electrode which is arranged between the first piezoelectric layer and the second piezoelectric layer;

a first conductive pattern which is arranged in an area disposed on an outer side of the plurality of first electrodes on the surface of the first piezoelectric layer on the side opposite to the second piezoelectric layer;
a conducting portion which is arranged in a through-hole penetrating through the first piezoelectric layer and which allows the second electrode and the first conductive pattern to be in conduction, the through-hole being formed in the first conductive pattern; and
a second conductive pattern which is arranged between the through-hole and the plurality of first electrodes on the surface of the first piezoelectric layer on the side opposite to the second piezoelectric layer.

2. The liquid discharge apparatus according to claim 1, wherein:
the plurality of nozzles form a plurality of nozzle rows, each of the nozzle rows is composed of the nozzles aligned in a predetermined first direction, the plurality of nozzle rows are arranged in a second direction perpendicular to the first direction;
the plurality of pressure chambers corresponding to the plurality of nozzles form a plurality of pressure chamber rows, each of the pressure chamber rows is composed of the pressure chambers aligned in the first direction, the plurality of pressure chamber rows are arranged in the second direction;
the plurality of first electrodes corresponding to the plurality of pressure chambers form a plurality of first electrode rows, each of the first electrode rows is composed of first electrodes aligned in the first direction, the plurality of first electrode rows are arranged in the second direction;
the first conductive pattern is arranged in at least one side area of both side areas of the plurality of first electrode rows in the first direction; and
the second conductive pattern is arranged between the plurality of first electrode rows and the first conductive pattern in the first direction.

3. The liquid discharge apparatus according to claim 2, wherein:
each of the first electrode rows has row-end electrodes which are first electrodes positioned at both ends of each of the first electrode rows in the first direction; and
the second conductive pattern has a plurality of dummy electrode portions each of which is aligned with the row-end electrode in the first direction.

4. The liquid discharge apparatus according to claim 3, wherein:
the first conductive pattern and the second conductive pattern are arranged in the both side areas of the plurality of first electrode rows in the first direction; and
the plurality of dummy electrode portions are aligned with the row-end electrodes positioned on the both ends of the plurality of first electrode rows in the first direction.

5. The liquid discharge apparatus according to claim 3, wherein the second conductive pattern has a connecting portion which connects the dummy electrode portions adjoining in the second direction.

6. The liquid discharge apparatus according to claim 5, wherein a width in the first direction of the connecting portion is smaller than a width in the first direction of the dummy electrode portion.

7. The liquid discharge apparatus according to claim 3, wherein:
the piezoelectric actuator has at least three rows of the first electrode rows arranged in the second direction, and the three rows include a central first electrode row, and other two first electrode rows which disposed on both sides of the central first electrode row;
an row-end electrode of the central first electrode row is arranged at a position separated farther from the first conductive pattern in the first direction than row-end electrodes of the other two first electrode rows;
a central dummy electrode portion, which is aligned with the row-end electrode of the central first electrode row, is arranged at a position separated farther from the first conductive pattern in the first direction than two dummy electrode portions aligned with the row-end electrodes of the other two first electrode rows; and
the through-hole is formed at a position aligned with the central dummy electrode portion in the first direction, and the through-hole is not formed at positions aligned with the two dummy electrode portions in the first direction.

8. The liquid discharge apparatus according to claim 7, wherein:
the first conductive pattern has two first portions which are arranged on both sides in the first direction of the plurality of first electrode rows respectively, and two second portions which are arranged on both sides in the second direction of the plurality of first electrode rows respectively;
the second conductive pattern extends in the second direction between the plurality of first electrode rows and the first portions of the first conductive pattern; and
spaces are formed between both end portions in the second direction of the second conductive pattern and the two second portions of the first conductive pattern respectively.

9. The liquid discharge apparatus according to claim 8, wherein:
a plurality of the through-holes formed in the first portion of the first conductive pattern is arranged along the second direction;
a through-hole of the plurality of the through-holes, which is disposed at a position nearest to the space, is aligned with a dummy electrode portion of the plurality of dummy electrode portions in the first direction;
two dummy electrode portions are arranged on the both sides in the second direction of the dummy electrode portion aligned with the through-hole; and
a separation distance, which is provided between the first portion of the first conductive pattern and one dummy electrode portion, of the two dummy electrode portions, disposed nearer to the space, is smaller than a separation distance which is provided between the first portion of the first conductive pattern and another dummy electrode portion of the two dummy electrode portions.

10. The liquid discharge apparatus according to claim 3, wherein:
the first electrodes are aligned at an alignment interval P in the first direction in the first electrode row;
the dummy electrode portion has the same shape as that of the first electrode; and
a separation distance in the first direction, which is provided between the row-end electrode of the first electrode row and the dummy electrode portion aligned with the row-end electrode, is equal to the alignment interval P.

11. The liquid discharge apparatus according to claim 2, wherein the second conductive pattern extends in the second direction.

12. The liquid discharge apparatus according to claim 2, wherein:

the first conductive pattern is arranged to surround the plurality of first electrode rows; and the second conductive pattern extends in the first direction.

13. The liquid discharge apparatus according to claim 1, wherein a thickness of the second conductive pattern is thicker than a thickness of the first conductive pattern.

14. The liquid discharge apparatus according to claim 1, wherein the piezoelectric actuator is joined to the flow passage structure by an adhesive.

15. The liquid discharge apparatus according to claim 1, wherein:

the piezoelectric actuator further includes a wiring member;

the plurality of first electrodes and the first conductive pattern are connected to the wiring member; and the second conductive pattern is not connected to the wiring member.

16. The liquid discharge apparatus according to claim 1, wherein the first conductive pattern is not connected to the second conductive pattern.

17. A piezoelectric actuator comprising:

a first piezoelectric layer;

a second piezoelectric layer which is overlapped with the first piezoelectric layer;

a plurality of first electrodes which are arranged on a surface of the first piezoelectric layer on a side opposite to the second piezoelectric layer;

a second electrode which is arranged between the first piezoelectric layer and the second piezoelectric layer;

a first conductive pattern which is arranged in an area disposed on an outer side of the plurality of first electrodes on the surface of the first piezoelectric layer on the side opposite to the second piezoelectric layer;

a conducting portion which is arranged in a through-hole penetrating through the first piezoelectric layer and which allows the second electrode and the first conductive pattern to be in conduction, the through-hole being formed in the first conductive pattern; and a second conductive pattern which is arranged between the through-hole and the plurality of first electrodes on the surface of the first piezoelectric layer on the side opposite to the second piezoelectric layer.

* * * * *